United States Patent
Kanemoto (10) Patent No.: US 7,507,643 B2
(45) Date of Patent: *Mar. 24, 2009

(54) METHOD FOR MANUFACTURING SEMICONDUCTOR SUBSTRATE, METHOD FOR MANUFACTURING SEMICONDUCTOR DEVICE, AND SEMICONDUCTOR DEVICE

(75) Inventor: Kei Kanemoto, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 14 days.

This patent is subject to a terminal disclaimer.

(21) Appl. No.: 11/605,884

(22) Filed: Nov. 29, 2006

(65) Prior Publication Data

US 2007/0132026 A1 Jun. 14, 2007

(30) Foreign Application Priority Data

Dec. 14, 2005 (JP) ............................. 2005-359983

(51) Int. Cl.
*H01L 27/12* (2006.01)
(52) U.S. Cl. ................... 438/479; 438/422; 257/347; 257/E21.415; 257/E21.564
(58) Field of Classification Search ................ 438/479, 438/149, 424; 257/347
See application file for complete search history.

(56) References Cited

U.S. PATENT DOCUMENTS

2007/0102735 A1* 5/2007 Kanemoto et al. .......... 257/288

FOREIGN PATENT DOCUMENTS

JP 2006-100681 A 4/2006
JP 2006-108206 A 4/2006
JP 2006-210683 8/2006

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

* cited by examiner

*Primary Examiner*—A. Sefer
(74) *Attorney, Agent, or Firm*—AdvantEdge Law Group, LLC (57) ABSTRACT

A method for manufacturing a semiconductor substrate includes forming a first semiconductor layer on a semiconductor base; forming a second semiconductor layer having a lower etching selection ratio than the first semiconductor layer on the first semiconductor layer; removing a part of the second semiconductor layer and a part of the first semiconductor layer around an element region so as to form a recess for a support, the recess exposing the semiconductor base; forming a support forming layer on the semiconductor base so as to fill the recess and cover the second semiconductor layer; etching a part excluding the recess and the element region so as to form a support and an exposed face exposing a part of an end face of the first semiconductor layer and a part of an end face of the second semiconductor layer located under the support; etching the first semiconductor layer through the exposed face so as to form a cavity between the second semiconductor layer and the semiconductor base; forming a buried insulating layer in the cavity; and planarizing a top surface of the second semiconductor layer so as to remove a part of the support located on the second semiconductor layer. The recess is formed in a single-crystalline epitaxial region on the semiconductor base.

5 Claims, 5 Drawing Sheets

METHOD FOR MANUFACTURING SEMICONDUCTOR SUBSTRATE, METHOD FOR MANUFACTURING SEMICONDUCTOR DEVICE, AND SEMICONDUCTOR DEVICE

BACKGROUND

1. Technical Field

The present disclosure relates to a method for manufacturing a semiconductor substrate, a method for manufacturing a semiconductor device, and a semiconductor device. In particular, the disclosure relates to a technique to form a silicon-on-insulator (SOI) structure on a semiconductor substrate.

2. Related Art

The above method for manufacturing a semiconductor substrate forms an SOI layer on a part of a bulk silicon substrate with a separation by bonding Si islands (SBSI) method, and further, an SOI transistor is formed on the SOI layer, as described in T. Sakai et al., Second International SiGe Technology and Device Meeting, Meeting Abstract, pp. 230-231, May (2004). Forming the SOI layer on a part of the bulk silicon substrate makes it possible to form the SOI transistor at a low cost.

Figure 11A:
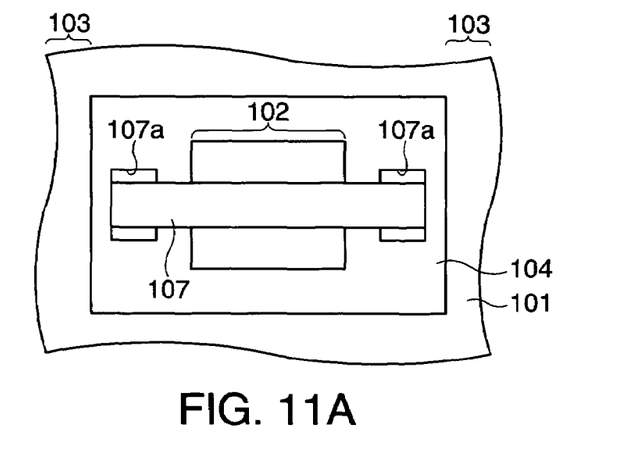
FIG. 11A is a schematic plan view thereof.
Figure 11B:
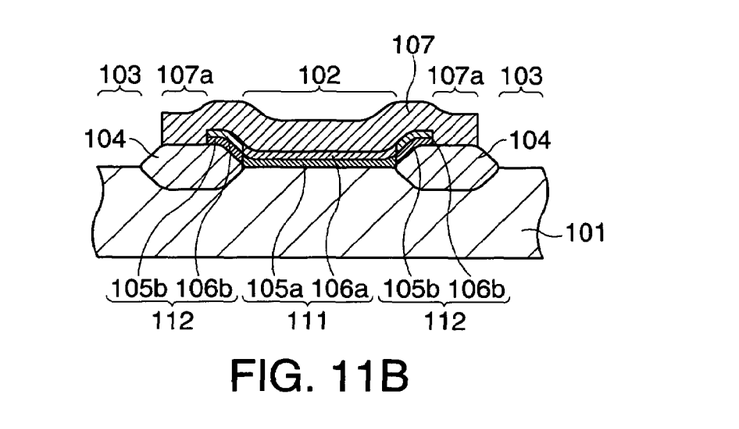
FIG. 11B is a schematic sectional view thereof.
Figure 12:
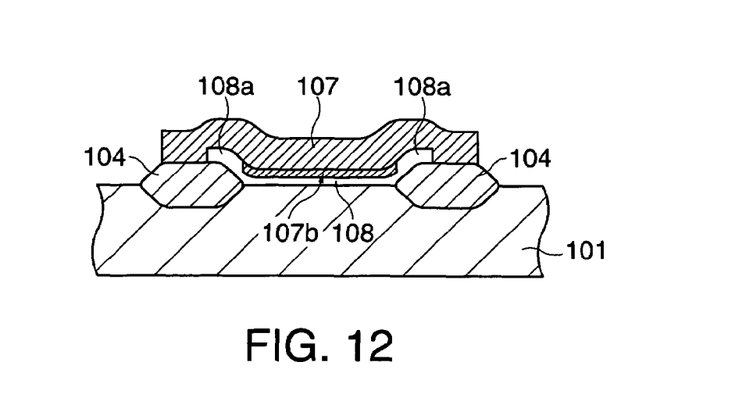
FIG. 12 is a schematic sectional view showing a related art structure of a semiconductor substrate.

A method for forming an SOI structure on a bulk silicon substrate will be described with reference to FIGS. 11A, 11B and FIG. 12. FIG. 11A is a schematic plan view showing a part of a method for manufacturing a semiconductor substrate and FIG. 11B is a schematic sectional view of FIG. 11A. FIG. 12 is a schematic sectional view showing a part of a method for manufacturing a semiconductor substrate. In a case where an SOI structure is formed on a bulk silicon substrate 101, it is conceivable that a local oxidation of silicon (LOCOS) oxide film 104 is formed on the bulk silicon substrate 101 so as to insulate a region for the SOI structure from a region for a bulk structure. As shown in FIG. 11B, for example, the LOCOS oxide film 104 can be formed on the bulk silicon substrate 101 in a manner to surround an SOI region 102 so as to insulate the SOI region 102 for the SOI structure from a bulk region 103 for the bulk structure. Next, silicon-germanium (SiGe) layers 105a and 105b and silicon (Si) layers 106a and 106b are grown epitaxially on the bulk silicon substrate 101 in accordance with the above SBSI method. This process forms a single-crystalline silicon layer 111 (including a first silicon-germanium layer 105a, and a first silicon layer 106a) on a part, corresponding to the SOI region 102, of the bulk silicon substrate 101. The single-crystalline silicon layer 111 succeeds the crystallinity of the bulk silicon substrate 101. At the same time, a polycrystalline silicon layer 112 (including a second silicone-germanium layer 105b and a second silicon layer 106b) is formed on the LOCOS oxide film 104.

Next, a recess 107a (refer to FIG. 11A) is formed so as to form a support 107 for supporting the silicon layer 106a. After an oxide film for forming a support 107 is formed, in order to obtain a form of an element region, a part, which is an exterior region of the element region, of each of the oxide film, the silicon layers 106a and 106b, and the silicon-germanium layers 105a and 105b is dry-etched. Then, the first silicon-germanium layer 105a is selectively etched by hydrofluoric-nitric acid, forming a cavity 108 (refer to FIG. 12) under the first silicon layer 106a which is supported by the support 107. Then, an insulating layer such as SiO$_2$ is implanted into the cavity 108, forming a buried oxide (BOX) layer between the bulk silicon substrate 101 and the silicon layer 106a. After that, a top surface of the bulk silicon substrate 101 is planarized so as to expose the first silicon layer 106a, forming an SOI structure at the SOI region 102 on the bulk silicon substrate 101.

However, in a case (refer to FIG. 11A) where the recess 107a is formed on the LOCOS oxide film 104 (including other oxide films), as shown in FIG. 11B, an end face (a side face) of a polycrystalline silicon layer 112 formed on the LOCOS oxide film 104 is exposed when the support 107 is formed. Therefore, when the first silicon-germanium layer 105a is removed by etching, the polycrystalline silicon layer 112 is exposed to hydrofluoric-nitric acid as well. Polycrystalline silicon has a higher etching rate than single-crystalline silicon, thereby being removed together with the first silicon-germanium layer 105a. Therefore, as shown in FIG. 12, a cavity 108a is formed at the lateral part, which should be remained, of the first silicon layer 106a, so that only an absorption power of an under face 107b of the support 107 supports the first silicon layer 106a. Accordingly, the first silicon layer 106a possibly peels off from the support 107. Peeling off of the first silicon layer 106 makes such a problem that a characteristic of a transistor element having an SOI structure is deteriorated, or the transistor element having an SOI structure can not be formed thereon.

SUMMARY

An advantage of the present disclosure is to provide a method for manufacturing a semiconductor substrate which can hold a second semiconductor layer not to peel off when a cavity is formed under the second semiconductor layer, a method for manufacturing a semiconductor device, and a semiconductor device.

A method for manufacturing a semiconductor substrate according to a first aspect of the disclosure includes: forming a first semiconductor layer on a semiconductor base; forming a second semiconductor layer having a lower etching selection ratio than the first semiconductor layer on the first semiconductor layer; removing a part of the second semiconductor layer and a part of the first semiconductor layer around an element region so as to form a recess, which exposes the semiconductor base, for a support; forming a support forming layer on the semiconductor base so as to fill the recess and cover the second semiconductor layer; etching a part excluding the recess and the element region so as to form a support and an exposed face exposing a part of an end face of the first semiconductor layer and a part of an end face of the second semiconductor layer located under the support; etching the first semiconductor layer through the exposed face so as to form a cavity between the second semiconductor layer and the semiconductor base; forming a buried insulating layer in the cavity; and planarizing a top surface of the second semiconductor layer so as to remove a part of the support located on the second semiconductor layer. The recess is formed in a single-crystalline epitaxial region on the semiconductor base.

According to this method, the recess is formed on the single-crystalline epitaxial region, so that a support formed in the recess and on the element region can attach firmly to the side face and the top face of the second semiconductor layer. Therefore, even if a cavity is formed under the second semiconductor layer by etching and removing the first semiconductor layer formed under the second semiconductor layer, by utilizing an etching selection ratio, the support can support the side face and the top face of the second semiconductor layer attaching firmly to the support, being able to prevent the second semiconductor layer from peeling off. Accordingly, the buried insulating layer can be buried as substitute for the first semiconductor layer, being able to manufacture the semiconductor substrate.

In the method, an epitaxial growth technique may be used in a process for forming the first semiconductor layer and a process for forming the second semiconductor layer. The method may further include exposing the semiconductor base by removing a part of the oxide film on the semiconductor base before forming the first semiconductor layer. The part of the oxide film corresponds to the single-crystalline epitaxial region.

In this method, since a part of the semiconductor base covered by the oxide film is exposed so as to form the single-crystalline epitaxial region in a process of exposing the semiconductor base, a part, the part corresponding to an exposed part, of the first semiconductor layer and the second semiconductor layer can be formed as a single crystal while succeeding a crystallinity of the semiconductor base, by the epitaxial growth technique. Therefore, the support formed in the single-crystalline epitaxial region can directly contact with the second semiconductor layer having a single crystallinity. Hence, when the first semiconductor layer is removed by etching, the second semiconductor layer having polycrystallinity and formed on the oxide film is prevented from contacting with the support, and the second semiconductor layer having single-crystallinity can be supported by the support. Consequently, when the first semiconductor layer is removed by etching, the second semiconductor layer can be prevented from peeling off or dropping.

In the method, the first semiconductor layer may be a silicon-germanium layer and the second semiconductor layer may be a silicon layer.

In this method, since silicon has a lower etching selection rate than silicon-germanium, a silicon-germanium layer may be selectively etched and removed while remaining the silicon layer. Therefore, a cavity may be formed so as to bury a buried insulating layer under the silicon layer.

A method for manufacturing a semiconductor device of a second aspect of the disclosure includes forming a transistor on the second semiconductor layer after performing the method for manufacturing a semiconductor substrate.

In this method, the second semiconductor layer having a single-crystallinity is prevented from peeling off from the support by being supported with the support formed on the single-crystalline epitaxial region, providing a method for manufacturing a semiconductor device which can maintain a characteristic of a transistor.

A semiconductor device of a third aspect of the disclosure has an SOI structure including the buried insulating layer buried as substitute for the first semiconductor layer in the semiconductor base, the second semiconductor layer on the buried insulating layer, and the support supporting the semiconductor layer. The support is formed in a single-crystalline epitaxial region on the semiconductor base.

In this structure, since a support layer is formed in the single-crystalline epitaxial region, the side face of the second semiconductor layer newly grown epitaxially while succeeding a crystallinity of the semiconductor base can attach firmly with the support layer. Therefore, even if a cavity is formed under the second semiconductor layer by etching and removing the first semiconductor layer formed under the second semiconductor layer, the support layer can support the second semiconductor layer having a single crystallinity, being able to prevent the second semiconductor layer from peeling off. Consequently, the buried insulating layer can be buried as substitute for the first semiconductor layer, providing a semiconductor device which can maintain a characteristic of a transistor well.

BRIEF DESCRIPTION OF THE DRAWINGS

The disclosure will be described with reference to the accompanying drawings, wherein like numbers reference like elements.

FIGS. 1A and 1B are schematic diagrams showing a method for manufacturing a semiconductor substrate in the order of processes according to an embodiment.

FIGS. 2A and 2B are schematic diagrams showing a method for manufacturing a semiconductor substrate.

FIGS. 3A and 3B are schematic diagrams showing a method for manufacturing a semiconductor substrate.

FIGS. 4A and 4B are schematic diagrams showing a method for manufacturing a semiconductor substrate.

FIGS. 5A and 5B are schematic diagrams showing a method for manufacturing a semiconductor substrate.

FIGS. 6A and 6B are schematic diagrams showing a method for manufacturing a semiconductor substrate.

FIGS. 7A and 7B are schematic diagrams showing a method for manufacturing a semiconductor substrate.

FIGS. 8A and 8B are schematic diagrams showing a method for manufacturing a semiconductor substrate.

FIGS. 9A and 9B are schematic diagrams showing a method for manufacturing a semiconductor device.

FIGS. 11A and 11B are schematic diagrams showing a related art method for manufacturing a semiconductor substrate.

DESCRIPTION OF THE EXEMPLARY EMBODIMENT

Hereinafter, a method for manufacturing a semiconductor substrate, a method for manufacturing a semiconductor device, and a semiconductor device according to an embodiment of the disclosure will now be described with reference to the accompanying drawings.

FIG. 1A through FIG. 8B are schematic diagrams showing a method for manufacturing a semiconductor substrate. In FIGS. 1A through 8B, each figure suffixed with the letter A is a schematic plan view, while each figure suffixed with the letter B is a schematic sectional view taken along the line A-A' in respective figures suffixed with the letter A. Herein, a method for manufacturing a semiconductor substrate is described with reference to FIGS. 1A through 8B. Note that the semiconductor substrate includes an SOI element forming region and a bulk element forming region so as to form a structure including an SOI structure in which an SOI element is formed and a bulk structure in which a bulk element is formed. Hereinafter, a method for manufacturing a semiconductor substrate is described with a method for forming a transistor in an SOI element forming region as an example.

Figure 1A:
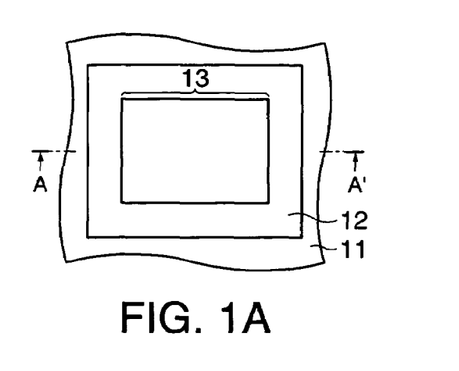
FIG. 1A is a schematic plan view thereof.
Figure 1B:
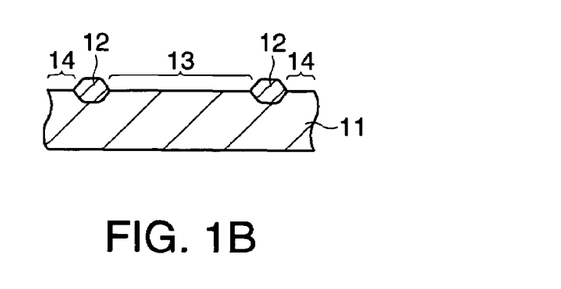
FIG. 1B is a schematic sectional view thereof.

In a process shown in FIG. 1, an element isolation film 12 is formed on a silicon substrate 11 which is a semiconductor base (a bulk silicon substrate). The element isolation film 12 is, for example, a local oxidation silicon (LOCOS) oxide film. The element isolation film 12 is formed in order to insulate electrically an SOI element forming region 13 in which a transistor having an SOI structure is to be formed from a bulk element forming region 14 in which a transistor having a bulk structure is to be formed. First, a silicon oxide film ($SiO_2$) (not shown) is formed over a silicon substrate 11. Next, a silicon nitride film (SiN) (not shown) is formed on parts, corresponding to the SOI element forming region 13 and the bulk element forming region 14, of the silicon substrate 11 by a photolithography technique. Then, a part, excluding the SOI element forming region 13 and the bulk element forming region 14, of the silicon substrate 11 is oxidized by using the silicon nitride film as a mask. Accordingly, the element isolation film 12 is formed on the part, excluding the SOI element forming region 13 and the bulk element forming region 14, of the silicon substrate 11.

Figure 2A:
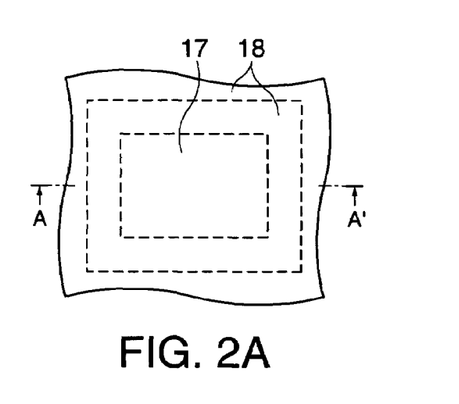
FIG. 2A is a schematic plan view thereof.
Figure 2B:
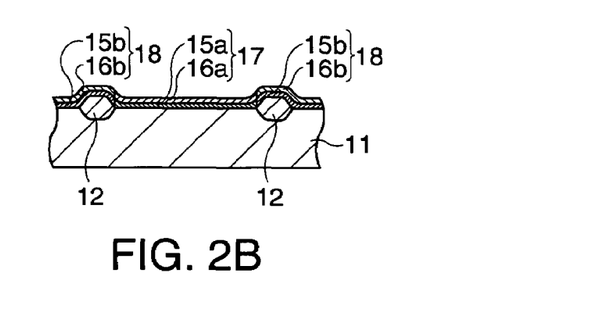
FIG. 2B is a schematic sectional view thereof.

In a process shown in FIG. 2, silicon-germanium (SiGe) layers 15a and 15b as first semiconductor layers and silicon (Si) layers 16a and 16b as second semiconductor layers are formed in order over the silicon substrate 11. First, the silicon oxide film (not shown) on the part, corresponding to the SOI element forming region 13 (refer to FIG. 1), of the silicon substrate 11 is removed by a photolithography technique. This process exposes the silicon substrate 11 only in the SOI element forming region 13.

Next, the silicon-germanium layers 15a and 15b as sacrifice layers and the silicon layers 16a and 16b for forming an SOI element are grown epitaxially in order on the silicon substrate 11 by an epitaxial growth technique. Before the silicon-germanium layer 15 is formed, a silicon buffer (Si Buffer) layer (not shown) is formed as an underlayer. Hereafter, a description of "a silicon buffer layer" is omitted. Hence, a single-crystalline epitaxial film 17 is formed on a part, corresponding to the SOI element forming region 13, of the silicon substrate 11. The single-crystalline epitaxial film 17 is newly grown while succeeding a crystallinity of the silicon substrate 11. The single-crystalline epitaxial film 17 includes a first silicon-germanium layer 15a and a first silicon layer 16a grown as a single crystal. On the other hand, a polycrystalline epitaxial film 18 is formed on the part excluding the SOI element forming region 13. The polycrystalline epitaxial film 18 includes a second silicon-germanium layer 15b and a second silicon layer 16b grown as a polycrystal.

Figure 3A:
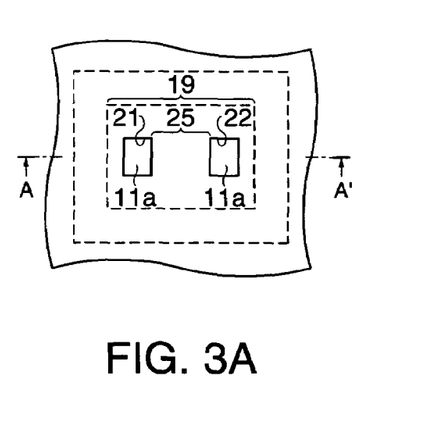
FIG. 3A is a schematic plan view thereof.
Figure 3B:
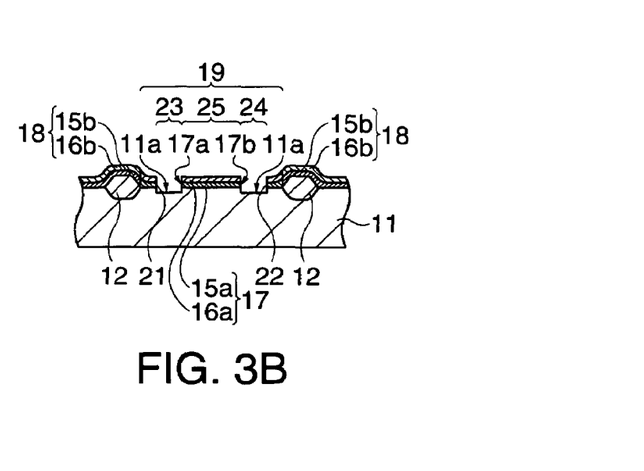
FIG. 3B is a schematic sectional view thereof.

In a process shown in FIG. 3, a first recess 21 and a second recess 22 for a support are formed on the single-crystalline epitaxial film 17. The photolithography technique forms a resist pattern (not shown) having openings on parts corresponding to a first recess forming region 23 in which the first recess 21 is to be formed and a second recess forming region 24 in which the second recess 22 is to be formed. Next, parts, corresponding to the first recess forming region 23 and the second recess forming region 24, of each of the first silicon layer 16a, the first silicon-germanium layer 15a, and the silicon substrate 11 are removed by etching in order by using the resist pattern as a mask.

Hence, the first recess 21 and the second recess 22 are formed on a single-crystalline epitaxial region 19. Further, since the first recess 21 and the second recess 22 are formed, one side face 17a of the single-crystalline epitaxial film 17, the other side face 17b thereof, and a top face 11a of the silicon substrate 11 are exposed. A region between the first recess 21 and the second recess 22 is an element region 25.

Figure 4A:
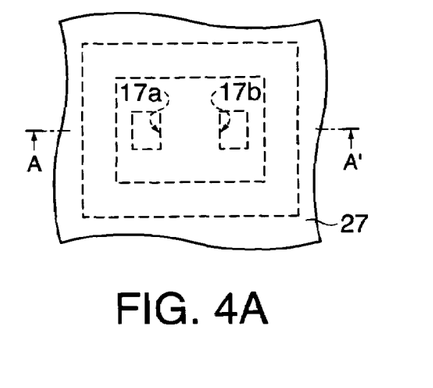
FIG. 4A is a schematic plan view thereof.
Figure 4B:
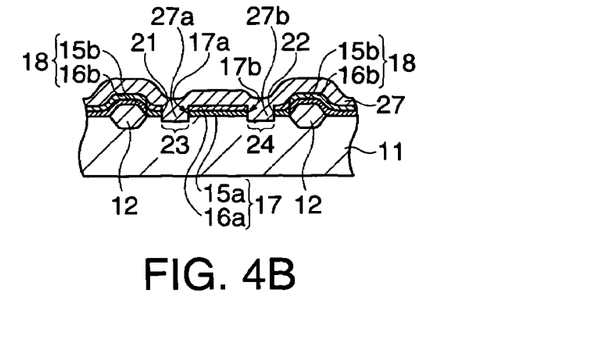
FIG. 4B is a schematic sectional view thereof.

In a process shown in FIG. 4, a support forming film 27 which is a support forming layer for a support 26 (refer to FIG. 5) is formed over the silicon substrate 11. The support forming film 27 is, for example, a silicon oxide film ($SiO_2$). First, the resist pattern used in the prior process is removed. Next, the support forming film 27 such as a silicon oxide film ($SiO_2$) and the like is formed over the silicon substrate 11 in a manner to fill the first recess 21 and the second recess 22 and cover the silicon layers 16a and 16b by, for example, a chemical vapor deposition (CVD) method and the like.

Forming such the support forming film 27 brings such a state that a part 27a, filling the first recess 21, of the support forming film 27 attaches firmly to the one side face 17a of the single-crystalline epitaxial film 17. On the other hand, a part 27b, filling the second recess 22, of the support forming film 27 attaches firmly to the other side face 17b of the single-crystalline epitaxial film 17.

Figure 5A:
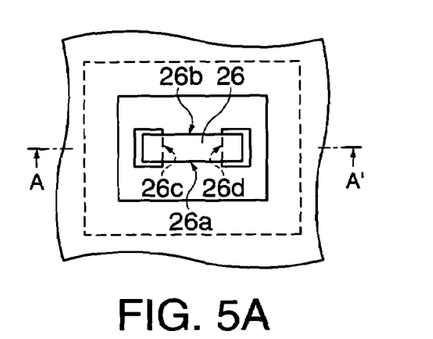
FIG. 5A is a schematic plan view thereof.
Figure 5B:
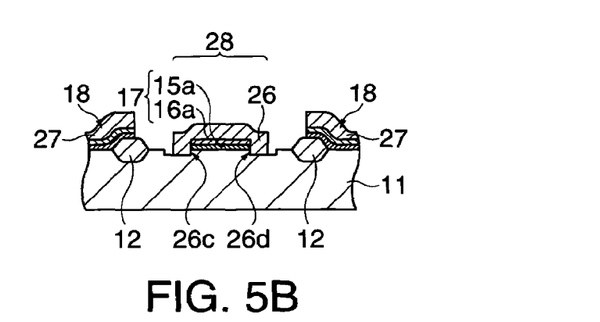
FIG. 5B is a schematic sectional view thereof.

In a process shown in FIG. 5, a part, excluding the support forming region 28 in which the support 26 is to be formed, of the support forming layer 27 is removed. A method for removing it is etching by using the resist pattern (not shown) in which a part of a region excluding a planar shape of the support 26 is open, as a mask. Further, a part, excluding the support forming region 28, of each of the single-crystalline epitaxial film 17 and the polycrystalline epitaxial film 18 is etched and removed by using the same resist pattern as a mask.

Accordingly, the support 26 is formed from the support forming film 27, and the first side face 26a and the second side face 26b of the support 26 (refer to FIG. 5A) are exposed. A third side face 26c and a fourth side face 26d of the support 26 attach firmly to side faces 17a and 17b respectively of the single-crystalline epitaxial film 17. Further, side faces, which are under the first side face 26a and the second side face 26b of the support 26, of the single-crystalline epitaxial film 17 are exposed surfaces in which the first silicon layer 16a and the first silicon-germanium layer 15a are exposed.

Figure 6A:
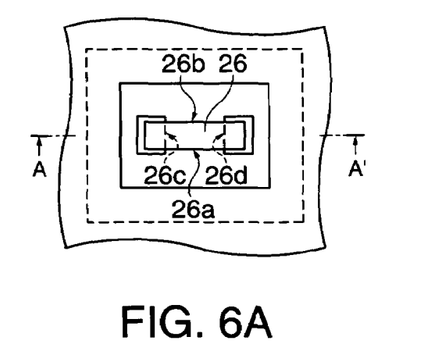
FIG. 6A is a schematic plan view thereof.
Figure 6B:
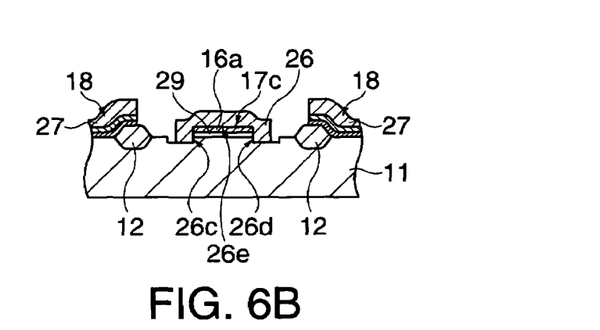
FIG. 6B is a schematic sectional view thereof.

In a process shown in FIG. 6, the first silicon-germanium layer 15a under the support 26 is removed selectively. First, the resist pattern used in the prior process is removed. Next, the single-crystalline epitaxial film 17 under the support 26 is contacted with an etching solution such as hydrofluoric-nitric acid and the like. In this case, the etching solution etches from exposed parts of the single-crystalline epitaxial film 17 (exposed faces under the first side face 26a and the second side face 26b of the support 26). Since the first silicon layer 16a has a lower etching selection ratio than the first silicon-germanium layer 15a, it is possible that the first silicon-germanium layer 15a is selectively etched and removed in a manner leaving the first silicon layer 16a.

Consequently, a cavity 29 which is hollow is formed between the silicon substrate 11 and the first silicon layer 16a. Though the silicon layer 16a loses a support on the under side thereof because the cavity 29 is formed, the first silicon layer 16a can be held (supported) by the third side face 26c and the fourth side face 26d of the support 26. In addition, it is supported also by an under face 26e of the support 26 attaching firmly with the first silicon layer 16a.

In a case where the support 26 (the recesses 21 and 22) is formed on the element isolation film 12, the support 26 contacts the polycrystalline epitaxial film 18 because the polycrystalline epitaxial film 18 is formed on the element isolation film 12. Therefore, when the first silicon-germanium layer 15a which is single-crystalline is etched, the polycrystalline epitaxial film 18 is removed together, making a gap between the support 26 and the first silicon layer 16a which should be kept. As a result, power for holding the first silicon layer 16a declines, so that the first silicon layer 16a may peel off or drop from the support 26.

However, in this embodiment, the support 26 is formed in the single-crystalline epitaxial region 19 (refer to FIG. 3), thereby contacting directly with the first silicon layer 16a which should be kept. Therefore, even if the cavity 29 is formed between the first silicon layer 16a and the silicon substrate 11 when the first silicon-germanium layer 15a is removed by etching, the support 26 supports a side face 17a, a side face 17b (refer to FIG. 4) and a top face 17c of the first silicon layer 16a, preventing the first silicon layer 16a from peeling off to drop or attaching other parts.

Figure 7A:
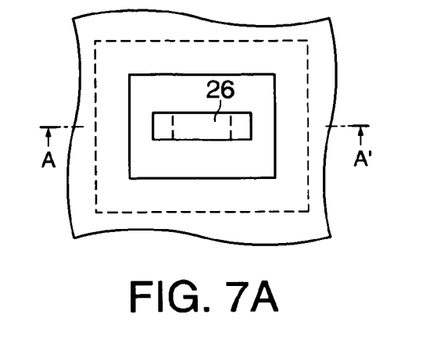
FIG. 7A is a schematic plan view thereof.
Figure 7B:
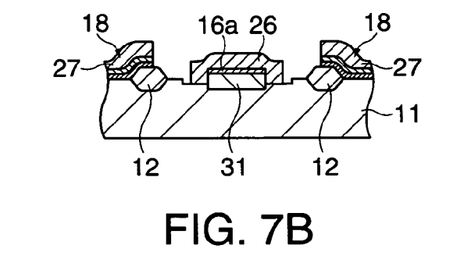
FIG. 7B is a schematic sectional view thereof.

In a process shown in FIG. 7, a buried insulating layer (BOX layer: Buried Oxide Layer) 31 is formed in the cavity 29 which is hollowed. The buried insulating layer 31 is, for example, a silicon oxide film which is formed by reaction of silicon included to the silicon substrate 11 and the first silicon layer 16a with oxygen by thermal oxidizing.

Figure 8A:
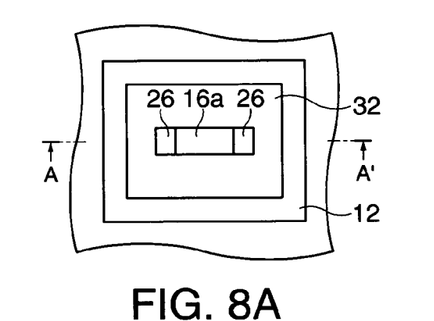
FIG. 8A is a schematic plan view thereof.
Figure 8B:
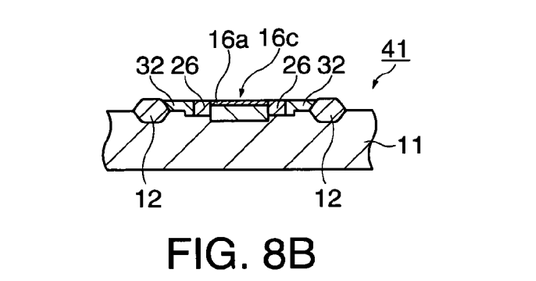
FIG. 8B is a schematic sectional view thereof.

In a process shown in FIG. 8, a semiconductor substrate 41 is formed. First, an insulating film 32 composed of a silicon oxide film is formed over the upper surface of the silicon substrate 11 so as to insulate electrically the SOI element. The insulating film 32 is formed, for example, by a CVD method. Next, the whole top surface of the silicon substrate 11 is planarized (planarization treatment) with chemical mechanical polishing (CMP) by using the polycrystalline epitaxial film 18 (refer to FIG. 7) as a stopper layer. Therefore, a part of the insulating film 32 and a part of the support 26 are removed. After that, another unnecessary part of the support 26, another part of the insulating film 32, and the polycrystalline epitaxial film 18 are further removed down to the height of the top face 16c of the first silicon layer 16a. If necessary, the first silicon-germanium layer 15a and the first silicon layer 16a formed on a part, outside of the element isolation film 12, of the silicon substrate 11 are removed. Hence, these processes exposes the top face 16c of the first silicon layer 16a, and forms such a structure (SOI structure) in which the first silicon layer 16a is element-isolated by the insulating film 32 and the buried insulating layer 31, on the silicon substrate 11. Accordingly, the semiconductor substrate 41 is formed.

As mentioned above, according to the method for manufacturing the semiconductor substrate 41, the support 26 is formed on the basis of the recesses 21 and 22 formed in the single-crystalline epitaxial region 19, so that the first silicon layer 16a which is single-crystalline can attach firmly to the third side face 26c and the fourth side face 26d of the support 26. Therefore, even if a cavity is formed under the first silicon layer 16a by removing the first silicon-germanium layer 15a by etching, the first silicon layer 16a can be supported by the support 26, enabling the first silicon layer 16a not to peel off and drop from the support 26. Accordingly, the buried insulating layer 31 can be buried as substitute for the first silicon-germanium layer 15a.

Figures 9A, 9B:
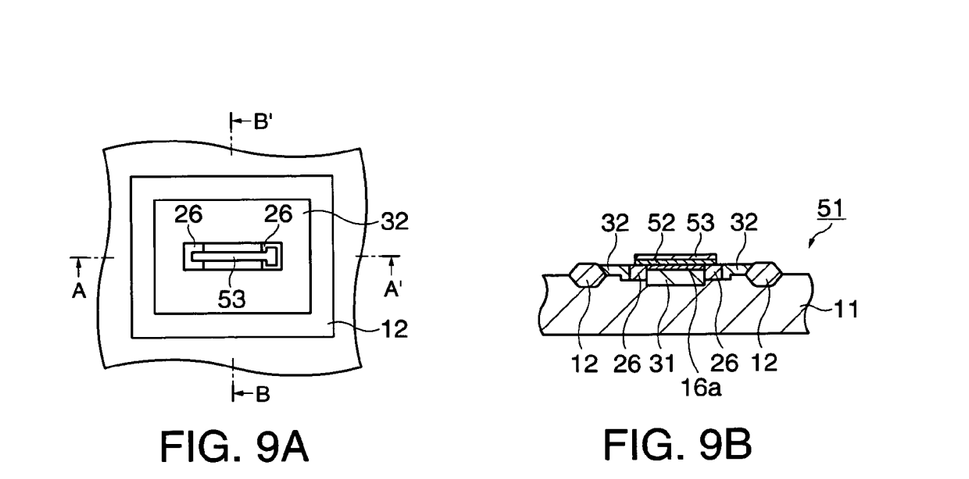
FIG. 9A is a schematic plan view thereof.
FIG. 9B is a schematic sectional view thereof.

FIGS. 9A and 9B are schematic views showing a method for manufacturing a semiconductor device. FIG. 9A is a schematic plan view showing a method for manufacturing a semiconductor device. FIG. 9B is a schematic sectional view taken along the line A-A' in FIG. 9A. Herein, a method for manufacturing a semiconductor device is described with reference to FIGS. 9A and 9B. Note that a method for manufacturing a semiconductor device is performed successively to the method for manufacturing a semiconductor substrate described in FIGS. 1A through 8B.

A process shown in FIG. 9 forms a semiconductor device 51. First, the top face of the first silicon layer 16a is thermally oxidized so as to form a gate insulating film 52 thereon. Then, a polycrystalline silicon layer is formed on the gate insulating film 52 by, for example, a CVD method. After that, the polycrystalline silicon layer is patterned by using a photolithography technique, forming a gate electrode 53 on the gate insulating film 52.

Next, impurity ions such as arsenic (As), phosphorus (P), boron (B), and the like are implanted into the first silicon layer 16a by using the gate electrode 53 as a mask. Therefore, LDD layers 54a and 54b (refer to FIG. 10) are formed on the first silicon layer 16a. The LDD layers 54a and 54b are composed of low concentration impurity introduction layers disposed on lateral areas of the gate electrode 53. Then, an insulating layer is formed on the first silicon layer 16a provided with the LDD layers 54a and 54b, by the CVD method, for example, and the insulating layer is etched back by dry etching such as RIE. Therefore, side walls 55a and 55b are formed on side walls of the gate electrode 53.

Further, impurity ions such as As, P, B, and the like are implanted into the first silicon layer 16a by using the gate electrode 53 and the side walls 55a and 55b as masks. Hence, source-drain electrode layers 56a and 56b are formed on the lateral areas of the side walls 55a and 55b in the first silicon layer 16a. Consequently, a transistor is finally formed. In addition, a bulk element is formed on the bulk element forming region 14, forming the semiconductor device 51 in which an SOI element and a bulk element are fabricated together on the silicon substrate 11.

As mentioned above, according to the method for manufacturing the semiconductor device 51, a structure in which the support 26 formed on the single-crystalline epitaxial region 19 supports the first silicon layer 16a and prevents the first silicon layer 16a from peeling off, thereby providing the semiconductor device 51 which can maintain the characteristic of the transistor well.

Figure 10:
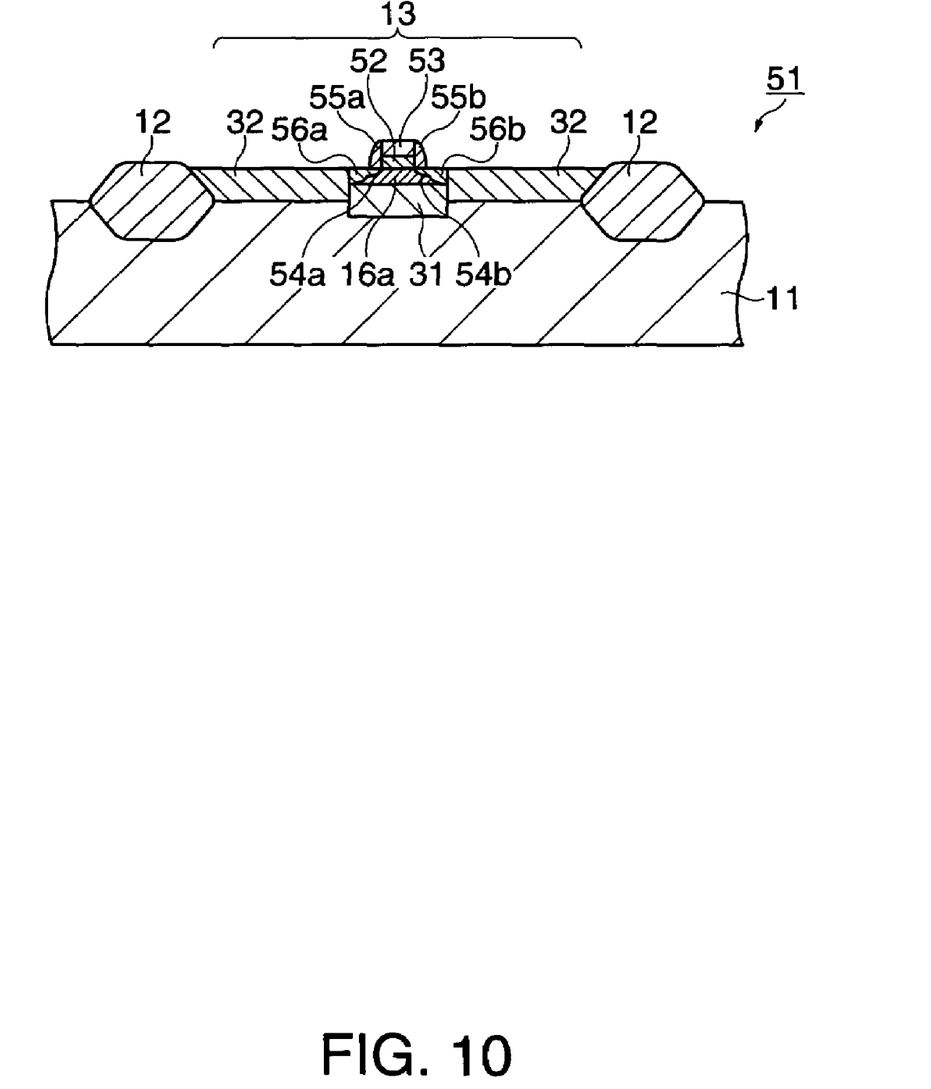
FIG. 10 is a schematic sectional view showing a structure of a semiconductor device.

FIG. 10 is a schematic sectional view taken along the line B-B' in FIG. 9A. Herein, a structure of a semiconductor device is described with reference to FIG. 10.

As shown in FIG. 10, the semiconductor device 51 includes the silicon substrate 11, the element isolation film 12, the SOI element forming region 13, and the bulk element forming region 14 (refer to FIG. 1). The silicon substrate 11 is used for fabricating a transistor having the SOI structure and a transistor having the bulk structure together thereon.

The element isolation film 12 is formed on the silicon substrate 11 so as to isolate electrically a P-type transistor from an N-type transistor as well as isolate the SOI element from the bulk element mentioned above.

The SOI element forming region 13 is a region where the SOI element is to be formed, and includes the buried insulating layer 31 buried as substitute for the first silicon-germanium layer 15a, the first silicon layer 16a formed on the buried insulating layer 31, the source-drain electrode layers 56a and 56b formed in the first silicon layer 16a, the gate insulating film 52, and the gate electrode 53 formed on the first silicon layer 16a. As mentioned above, the side walls 55a and 55b are formed on the side walls of the gate insulating film 52 and the gate electrode 53. As can be seen, such a transistor is formed that the gate insulating film 52 and the gate electrode 53 are formed on the top of the first silicon layer 16a.

The bulk element forming region is a region where the bulk element is to be formed, and includes the source-drain electrode layers formed in the silicon substrate 11, the gate insulating film and the gate electrode formed on the silicon substrate 11.

As can be seen, the support 26 (refer to FIG. 6) formed on the single-crystalline epitaxial region 19 supports the first silicon layer 16a in the SOI structure, so that the first silicon layer 16a is prevented from peeling off or dropping, providing the semiconductor device 51 which can maintain the characteristic of the transistor, accordingly.

As mentioned above, according to the method for manufacturing a semiconductor substrate, the method for manufacturing a semiconductor device, and the semiconductor device of the embodiment, the following advantageous effects are obtained.

According to the embodiment, since the recesses 21 and 22 for the support 26 are formed on the single-crystalline epitaxial region 19, the support 26 formed in the recesses 21 and 22 and on the element region 25 can attach firmly to the first silicon layer 16a. Therefore, even if the cavity 29 is formed under the first silicon layer 16a by etching and removing the first silicon-germanium layer 15a formed under the first silicon layer 16a, the first silicon layer 16a can be held (supported) by the support 26, enabling the first silicon layer 16a not to peel off or drop. This step can provide a method for manufacturing the semiconductor substrate 41 in which the buried insulating layer 31 can be buried as substitute for the first silicon-germanium layer 15a formed under the first silicon layer 16a and a method for manufacturing the semiconductor device 51.

According to the embodiment, since the support 26 formed on the single-crystalline epitaxial region 19 supports the first silicon layer 16a, the first silicon layer 16a is prevented from peeling off, providing the semiconductor device 51 which can suppress the deterioration of the characteristic of the transistor.

Note that the embodiment is not limited to the above, but it can be applied as follows.

(Modification 1) The method for forming the buried insulating layer 31 in the cavity 29 is not limited to the thermal oxidation method in the above. It may be formed by, for example, the CVD method.

(Modification 2) Silicon is exemplified as material of the semiconductor base in the above, but it is not limited. For example, Ge, SiGe, SiC, SiSn, PbS, GaAs, InP, GaP, GaN, ZnSe, and the like may be used.

(Modification 3) Silicon-germanium and silicon are exemplified as material of the first semiconductor layer and the second semiconductor layer respectively in the above, but it is enough to select the second semiconductor layer having a lower etching selection ratio than the first semiconductor layer. For example, a combination selected from Ge, SiC, SiSn, PbS, GaAs, InP, GaP, GaN, ZnSe, and the like may be used as material of the first semiconductor layer and the second semiconductor layer.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of the present disclosure. This disclosure is intended to cover any adaptations or variations of the embodiments discussed herein. Therefore, it is manifestly intended that embodiments in accordance with the present disclosure be limited only by the claims and the equivalents thereof.

What is claimed is:

1. A method for manufacturing a semiconductor substrate, comprising;
    forming a first semiconductor layer on a semiconductor base;
    forming a second semiconductor layer having a lower etching selection ratio than the first semiconductor layer on the first semiconductor layer;
    removing a part of the second semiconductor layer and a part of the first semiconductor layer around an element region so as to form a recess for a support, the recess exposing the semiconductor base;
    forming a support forming layer on the semiconductor base so as to fill the recess and cover the second semiconductor layer;
    etching a part of the support forming layer and the first and second semiconductor layers excluding portions corresponding to the recess and the element region so as to form a support and an exposed face exposing a part of an end face of the first semiconductor layer and a part of an end face of the second semiconductor layer located under the support;
    etching the first semiconductor layer through the exposed face so as to form a cavity between the second semiconductor layer and the semiconductor base;
    forming a buried insulating layer in the cavity; and
    planarizing a top surface of the second semiconductor layer so as to remove a part of the support located on the second semiconductor layer,
wherein the recess is formed in a single-crystalline epitaxial region on the semiconductor base.

2. The method for manufacturing a semiconductor substrate according to claim 1, further comprising exposing the semiconductor base by removing a part of an oxide film on the semiconductor base corresponding to the single crystalline epitaxial region before forming the first semiconductor layer; and wherein the first semiconductor layer and the second semiconductor layer are formed by using an epitaxial growth technique.

3. The method for manufacturing a semiconductor substrate according to claim 1, wherein the first semiconductor layer is a silicon-germanium layer, and the second semiconductor layer is a silicon layer.

4. A method for manufacturing a semiconductor device, comprising:
    forming a transistor on the second semiconductor layer after performing the method for manufacturing a semiconductor substrate according to claim 1.

5. A semiconductor device, comprising;
    a silicon on insulator (SOI) structure manufactured by the method according to claim 1.

* * * * *